United States Patent [19]
Lin et al.

[11] Patent Number: 6,054,348
[45] Date of Patent: Apr. 25, 2000

[54] SELF-ALIGNED SOURCE PROCESS

[75] Inventors: Ruei-Ling Lin, Kaohsiung; Ching-Hsiang Hsu; Mong-Song Liang, both of Hsin-Chu, all of Taiwan

[73] Assignee: Taiwan Semiconductor Manufacturing Company, Hsin-Chu, Taiwan

[21] Appl. No.: 09/079,880

[22] Filed: May 15, 1998

[51] Int. Cl.$^7$ .................................................. H01L 21/336
[52] U.S. Cl. ............................ 438/257; 438/258; 438/302
[58] Field of Search ..................................... 438/302, 258, 438/257, 301, 299, 253, 197

[56] References Cited

U.S. PATENT DOCUMENTS

| | | | |
|---|---|---|---|
| 4,373,248 | 2/1983 | McElroy | 29/571 |
| 4,814,286 | 3/1989 | Tam | 437/27 |
| 4,861,730 | 8/1989 | Hsia et al. | 437/43 |
| 5,103,274 | 4/1992 | Tang et al. | 357/23.5 |
| 5,120,671 | 6/1992 | Tang et al. | 437/43 |
| 5,344,787 | 9/1994 | Nagalingam et al. | 437/35 |
| 5,498,556 | 3/1996 | Hong et al. | 437/35 |
| 5,597,754 | 1/1997 | Lou et al. | 437/52 |
| 5,635,416 | 6/1997 | Chen et al. | 438/258 |
| 5,770,877 | 6/1998 | Park | 257/315 |
| 5,773,861 | 6/1998 | Chen et al. | 257/316 |
| 5,950,088 | 9/1999 | Park | 438/266 |
| 5,960,283 | 9/1999 | Sato | 438/257 |

*Primary Examiner*—John F. Niebling
*Assistant Examiner*—Walter L. Lindsay, Jr.
*Attorney, Agent, or Firm*—George O. Saile; Stephen B. Ackerman

[57] ABSTRACT

A process for creating a semiconductor memory device, featuring the formation of FOX regions, after the creation of a source region, has been developed. The process features a source region, self-aligned to a first set of stacked gate structures, with the subsequent FOX region placed perpendicular to the source region, between a second set of stacked gate structures.

16 Claims, 5 Drawing Sheets

SELF-ALIGNED SOURCE PROCESS

BACKGROUND OF THE INVENTION

(1) Field of the Invention

The present invention relates to processes used to create semiconductor devices, and more specifically to a process used to self-align a source region, to a polysilicon gate structure, followed by the creation of a field oxide, (FOX), region.

(2) Description of Prior Art

One method for fabricating flash EPROM, (electrical programmable read only memory), devices, entails the use of a common source region. Prior art, such as Tang, et al, in U.S. Pat. No. 5,120,671, describes a fabrication sequence for a EPROM type device, using a common source region. In that invention the common source region is formed after the creation of both a polysilicon gate structure, and isolating field oxide, (FOX), islands. The process sequence used in this prior art can result in an unwanted corner rounding sequence of the FOX structures, resulting in less available area remaining for the subsequent source region. Thus designs are used, allowing additional area for the source region, however adversely influencing the trend to improved device density. The process sequence used in the cited prior art can also result in semiconductor substrate undercutting, during the removal of unwanted FOX regions, in regions to be used for the common source region. The unwanted substrate undercut can result in low breakdown voltages.

This invention will describe a process sequence in which a self-aligned source region, for a subsequent semiconductor memory device, such as an EPROM type device, is formed after creation of a stacked gate structure, but before formation of the isolating FOX regions. This sequence places FOX regions only in desired locations, eliminating the need for removal of unwanted FOX regions, thus eliminating the possible damage created in the semiconductor substrate, during the FOX removal procedure, encountered with prior art. In addition the creation of the FOX region, post stacked gate formation, results in birds beak formation, under the stacked gate structures, decreasing a capacitance component, which enables an increase in the coupling ratio, of the EPROM type device, to be realized.

SUMMARY OF THE INVENTION

It is an object of this invention to self-align a common source region, for a semiconductor memory device, such as an EPROM device, to rows of stacked gate structure islands.

It is another object of this invention to form the isolating FOX regions, for the semiconductor memory device, after creation of stacked gate structures, and the common source region.

In accordance with the present invention a process is described for self-aligning a common source region, of an EPROM device, to islands of stacked gate structures, followed by the formation of isolating FOX regions. After the creation of islands of stacked gate structures, on thin gate insulators, an ion implantation procedure is used to create a source region, in a first region of a semiconductor substrate, with the source region self-aligned between adjacent rows of stacked gate structures. A silicon nitride pattern is next formed, followed by an oxidation procedure, creating isolating FOX regions, in a second region of the semiconductor substrate, in areas not covered by the masking silicon nitride pattern, with the FOX regions placed between adjacent rows of stacked gate structure islands, normal in direction to the previously formed source region.

BRIEF DESCRIPTION OF THE DRAWINGS

The object and other advantages of this invention are best described in the preferred embodiment with reference to the attached drawings that include:

FIGS. 1a –4a, which schematically show top views of the common source region, formed prior to formation of isolating FOX regions, and self-aligned to stacked gate structures.

FIGS. 1b –4b, 3c –4c, and 4d, which schematically, in cross-sectional style, show key fabrication stages, used to create a source region, formed prior to creation of a FOX region, and self-aligned to stacked gate structures.

DESCRIPTION OF THE PREFERRED EMBODIMENTS

A method for creating a source region, used for an EPROM type device, self-aligned to stacked gate structures, and formed prior to the formation of FOX isolation regions, will now be described in detail. The self-aligned source process, will be applied to semiconductor memory device, such as an EPROM type device, therefore the description of the invention will concentrate on the process for creating the self-aligned source region, not the EPROM device.

Figure 1A:
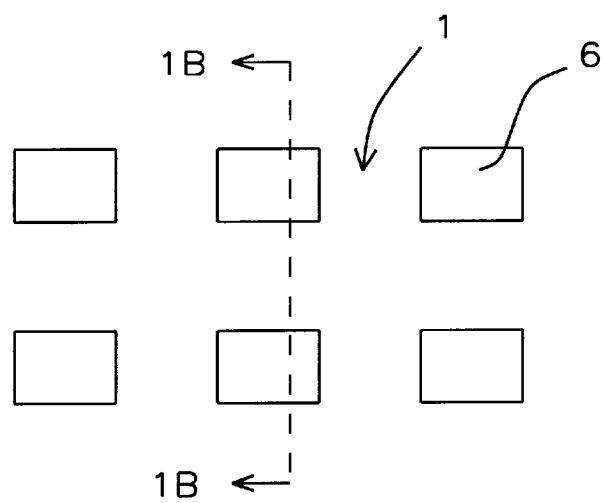
Figure 1B:
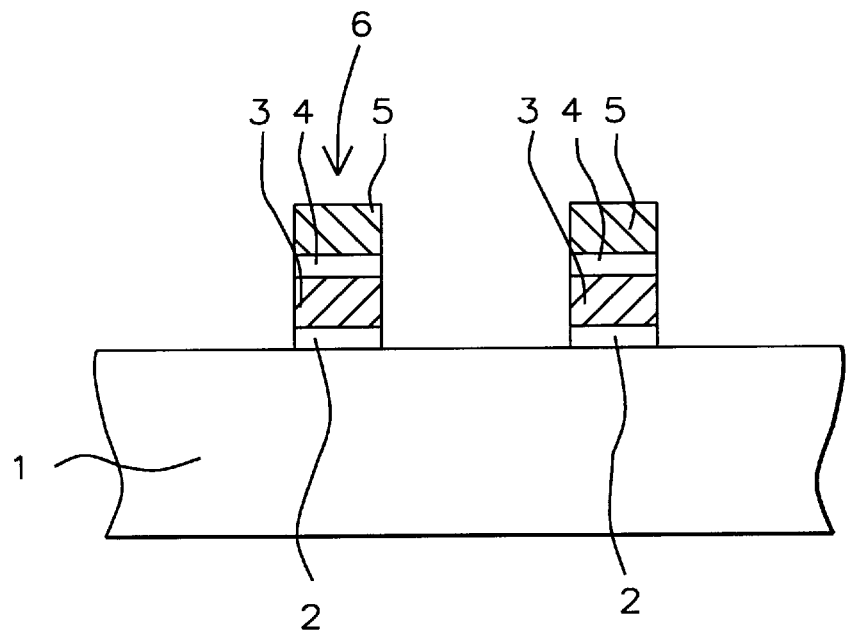

A P type, semiconductor substrate 1, comprised of single crystalline silicon, with a <100> crystallographic orientation, is used and shown schematically in the top view of FIG. 1a, and shown cross-sectionally in FIG. 1b. A thin gate insulator layer 2, of silicon dioxide, is thermally grown on semiconductor substrate 1, to a thickness between about 50 to 100 Angstroms. A first polysilicon layer 3, is next deposited, using low pressure chemical vapor deposition, (LPCVD), procedures, to a thickness between about 1500 to 2000 Angstroms. Polysilicon layer 3, can be grown using in situ doping procedures, via the addition of either arsine or phosphine, to a silane ambient, or polysilicon layer 3, can be deposited intrinsically, and doped via ion implantation of either arsenic or phosphorous. A dielectric layer 4, of Oxidized silicon Nitride on Oxide, (ONO), is next formed on polysilicon layer 3, via initially thermally growing a silicon oxide layer, on polysilicon layer 3, followed by the deposition of a silicon nitride layer, via an LPCVD procedure, and then oxidizing the silicon nitride layer, thus creating ONO layer 4, with an equivalent silicon oxide thickness between about 100 to 250 Angstroms. Another polysilicon layer 5, is then deposited to a thickness between about 2500 to 5000 Angstroms, again using LPCVD procedures, and again doped via an N type, in situ doping process, or N type ion implantation procedure. Conventional photoresist and anisotropic reactive ion etching, (RIE), procedures, using $Cl_2$ as an etchant for the polysilicon layers, and using $CHF_3$ as an etchant for the ONO layer, is employed to create the stacked gate structures 6, schematically shown in FIG. 1a, and FIG. 1b. Photoresist removal is accomplished via plasma oxygen ashing and careful wet cleans.

Figure 2A:
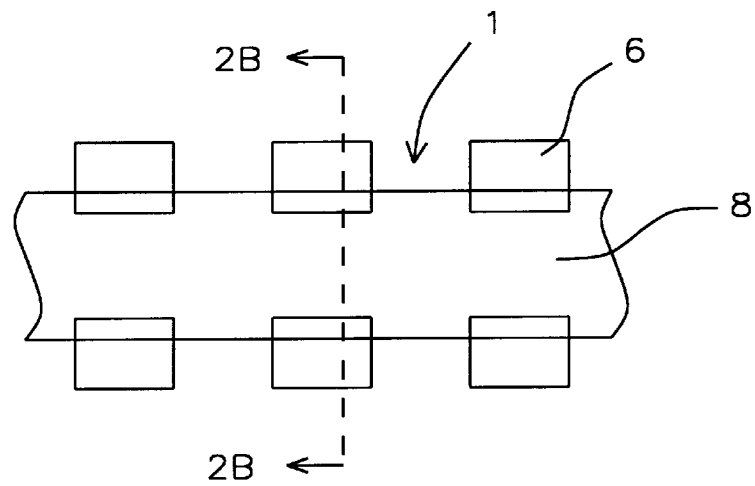
Figure 2B:
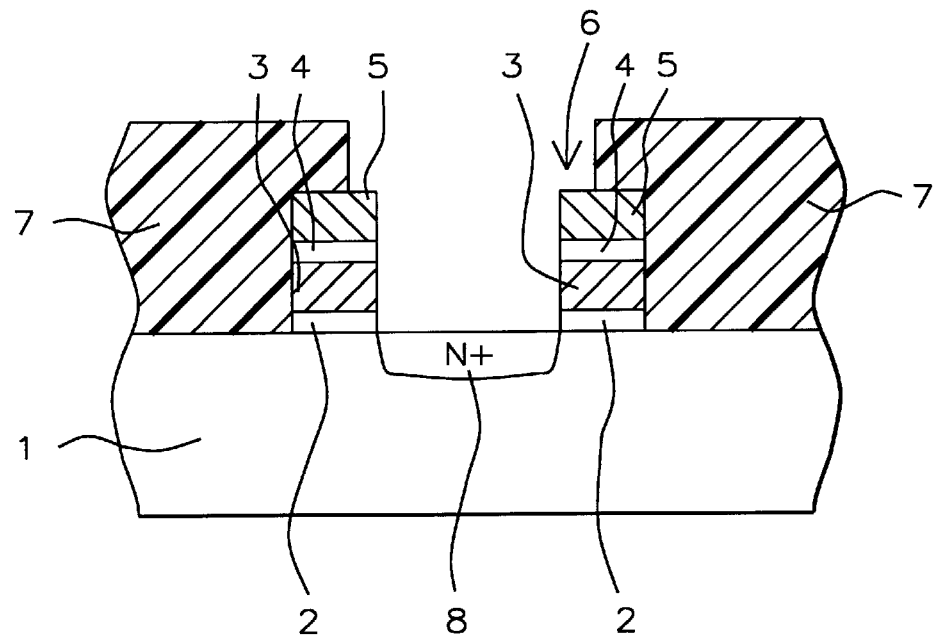

A photoresist shape 7, schematically shown in FIG. 2b, is used to allow the creation of a source region 8, to be formed in a first region of semiconductor substrate 1, self-aligned to stacked gate structures 6, (FIG. 2b), with the source region 8, now located between a first set of stacked gate structures 6, schematically shown in the top view in FIG. 2a. Source region 8, is created via ion implantation of either arsenic or phosphorous, at an energy between about 30 to 60 KeV, at a dose between about 3E15 to 5E15 atoms/$cm^2$.

Figure 3A:
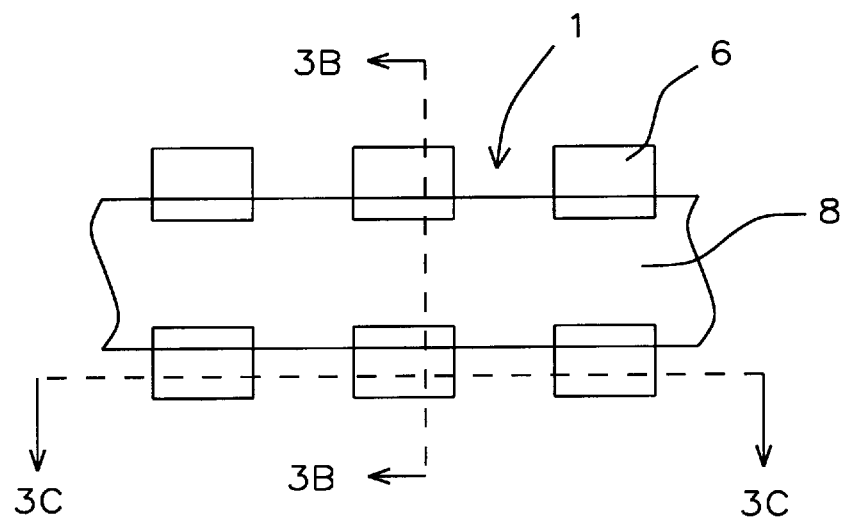
Figure 3B:
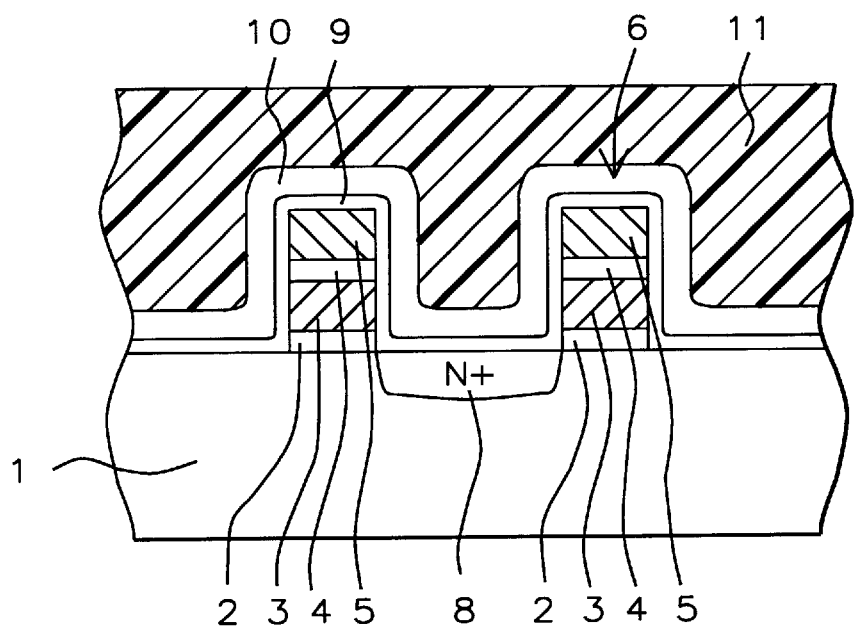
Figure 3C:
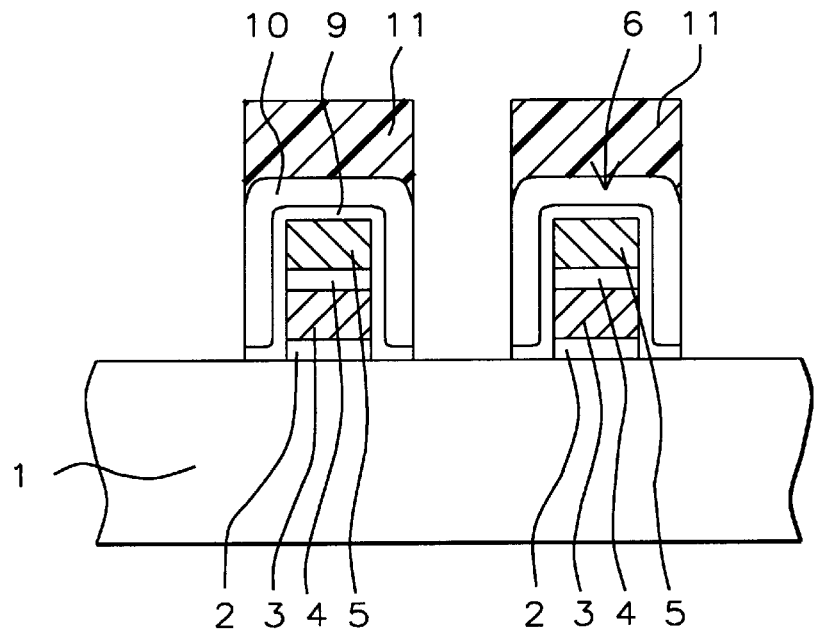

After removal of photoresist shape 7, via plasma oxygen ashing and careful wet cleans, a composite insulator layer is deposited. The composite insulator layer is comprised of an underlying pad silicon oxide layer 9, obtained via LPCVD or plasma enhanced chemical vapor deposition, (PECVD), procedures, at a thickness between about 250 to 500 Angstroms, followed by the deposition of an overlying silicon nitride layer 10, obtained again using either an LPCVD or an PECVD procedure, at a thickness between about 500 to 1500 Angstroms. A photoresist shape 11, is next formed to allow the composite insulator layer to be patterned, via an anisotropic RIE procedure, using $CF_4$ as an etchant, to provide the oxidation resistant masking pattern, needed for regions of semiconductor substrate 1, to be protected from an oxidation procedure, used to create a subsequent FOX region. This can be seen in the schematic cross-sectional views, displayed in FIG. 3b, and FIG. 3c.

Figure 4A:
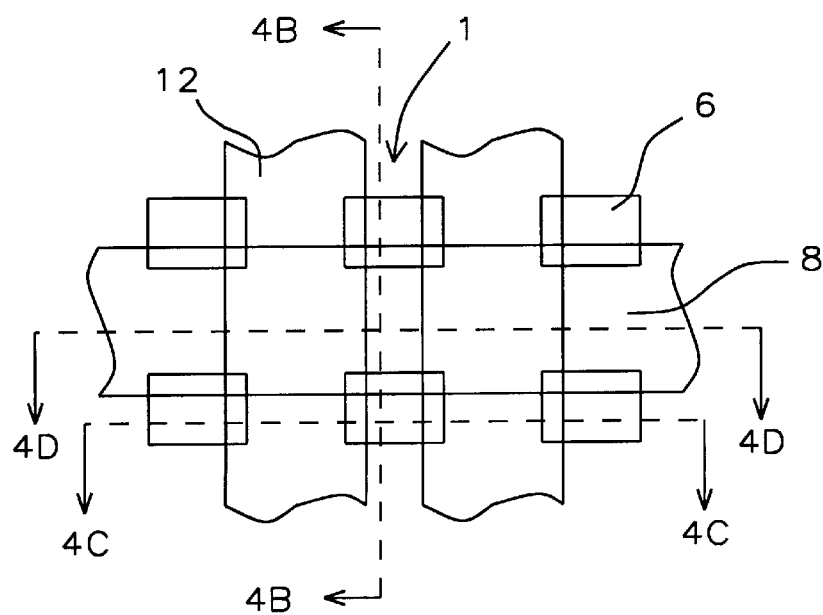
Figure 4B:
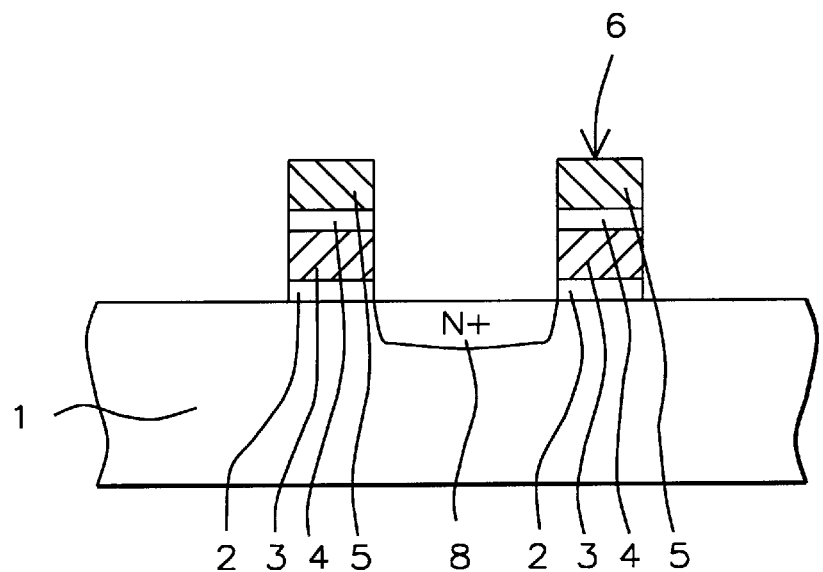
Figure 4C:
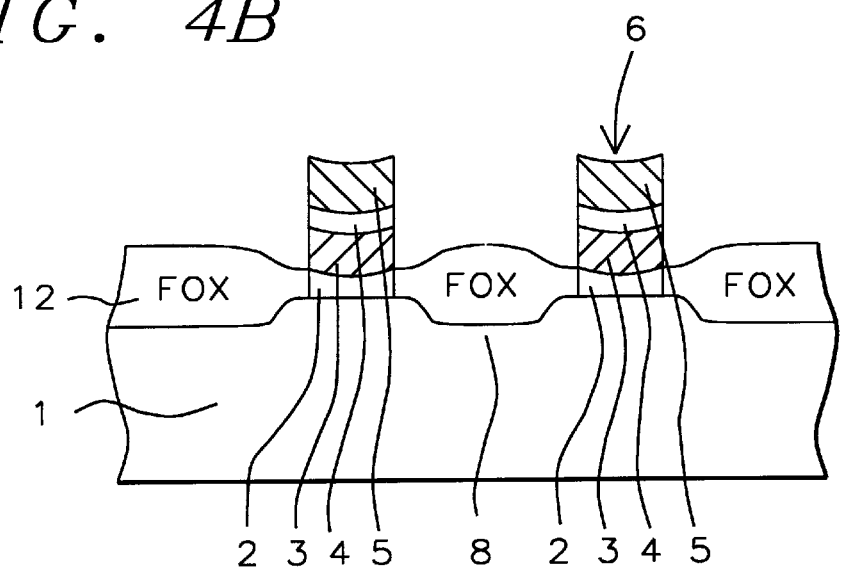
Figure 4D:
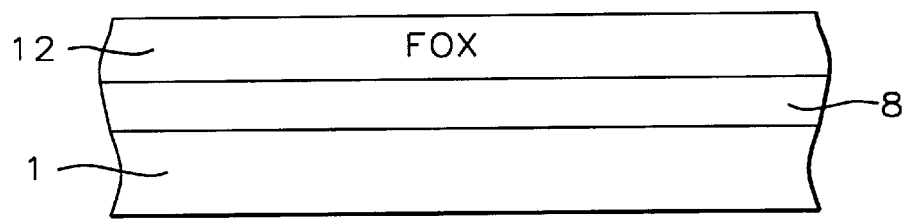

After removal of photoresist shape 11, again employing plasma oxygen ashing and careful wet cleans, FOX region 12, is thermally grown, in an oxygen—steam ambient, at a temperature between about 950 to 1000° C., to a thickness between about 2000 to 4000 Angstroms, in regions not protected by the composite insulator layer, featuring oxidation resistant silicon nitride layer 10. FOX regions 12, is schematically illustrated in the top view of FIG. 4a, as well as in the cross-sectional schematic views of FIG. 4b, FIG. 4c, and FIG. 4d. FOX regions 12 are formed between islands of stacked gate structures 6, with the FOX regions being created in a second region of semiconductor substrate 1, normal in direction to previously formed self-aligned source region 8. The formation of specific regions of FOX, removes the risk of substrate damage, encountered when the FOX regions are formed in all exposed silicon regions, and have to be removed from unwanted regions via dry etching procedures which can damage the underlying substrate, at the completion of the FOX growth. The substrate erosion, at the conclusion of the FOX removal, may include damage to the source region, resulting in undesirable device parameters. If a wet etching procedure is used to remove unwanted portions of FOX regions, removing the risk of substrate damage, a costly and difficult photolithographic procedure is needed for masking purposes. In addition the creation of FOX regions 12, after formation of the stacked gate structures 6, used in this invention, results in a desirable birds beak formation, protruding under the corners of stacked gate structures 6, shown schematically in FIG. 4c. The additional insulator thickness, created by the birds beak formation, results in a decrease in a component of capacitance, resulting in an increase in coupling ratio of a subsequent EPROM type device. The removal of the composite insulator layer pattern is accomplished via the use of hot phosphoric acid, for silicon nitride layer 10, and the use of a buffered hydrofluoric acid solution for pad silicon oxide layer 9.

The concluding processing steps, used to create a semiconductor memory device, such as an EPROM type device, with the source region self-aligned to stacked gate structures, and a FOX region formed after formation of the self-aligned source region, include the creation of a self-aligned drain region, a silicon oxide deposition and planarization procedure, followed by the formation of polycide word lines.

While this invention has been particularly shown and described with reference to the preferred embodiments thereof, it will be understood by those skilled in the art that various changes in form and details may be made without departing from the spirit and scope of this invention.

What is claimed is:

1. A method for forming a source region, in a semiconductor substrate, prior to the formation of field oxide regions, comprising the steps of:

forming stacked gate structures on said semiconductor substrate;

forming a source region, in a first region of said semiconductor substrate, self-aligned to said stacked gate structures, with said source region formed between a first set of rows of said stacked gate structures; and forming said field oxide regions, in second region of said semiconductor substrate, between a second set of rows of said stacked gate structures, and with said second set of rows of stacked gate structures, normal in direction to said first set of rows of stacked gate structures, in said first region of said semiconductor substrate.

2. The method of claim 1, wherein the stacked gate structures are formed on an underlying gate insulator layer of silicon dioxide, grown to a thickness between about 50 to 100 Angstroms.

3. The method of claim 1, wherein said stacked gate structures are formed from an overlying second polysilicon layer, at a thickness between about 2500 to 5000 Angstroms, an ONO layer, at an equivalent silicon dioxide thickness between about 100 to 250 Angstroms, and an underlying first polysilicon layer, at a thickness between about 1500 to 2000 Angstroms.

4. The method of claim 1, wherein said stacked gate structures are formed via an anisotropic RIE procedure, using $Cl_2$ as an etchant for polysilicon layers, and using $CHF_3$ as an etchant for a ONO layer.

5. The method of claim 1, wherein said source region, formed in said first region of said semiconductor substrate, is obtained via ion implantation of arsenic or phosphorous, at an energy between about 30 to 60 KeV, at a dose between about 3E15 to 5E15 atoms/$cm^2$.

6. The method of claim 1, wherein regions of said semiconductor substrate, not exposed to the oxidation procedure used to create said field oxide regions, are masked with a composite insulator layer, comprised of an overlying silicon nitride layer at a thickness between about 250 to 500 Angstroms, and an underlying silicon oxide layer, at a thickness between about 500 to 1500 Angstroms.

7. The method of claim 1, wherein said field oxide regions are formed in said second region, of said semiconductor substrate, via thermal oxidation, in an oxygen-steam ambient, at a temperature between about 950 to 1000° C., to a thickness between about 2000 to 4000 Angstroms.

8. A method of fabricating a semiconductor memory device, on a semiconductor substrate, with a field oxide region formed in a second region of said semiconductor substrate, between a second set of stacked gate structures, after the creation of a source region, formed in a first region of said semiconductor substrate, between a first set of stacked gate structures, in which the source region is self-aligned to the first set of stacked gate structures, comprising the steps of:

forming a gate insulator layer on said semiconductor substrate;

depositing a first polysilicon layer;

forming an ONO layer on said first polysilicon layer;

depositing a second polysilicon layer;

patterning of said second polysilicon layer, of said ONO layer, and of said first polysilicon layer, to form said stacked gate structures;

forming a photoresist shape;

forming said source region, in said first region of said semiconductor substrate, exposed in an opening in said photoresist shape, with said source region self-aligned to said first set of stacked gate structures;

depositing a composite insulator layer comprised of a silicon nitride, overlying a silicon oxide layer;

patterning of said composite insulator layer, exposing a second region of said semiconductor substrate, located between said second set of stacked gate structures, with said second set of stacked gate structures, normal in direction to said first set of stacked gate structures;

forming said field oxide region in said second region of said semiconductor substrate;

removing remaining composite insulator layer; and forming a self aligned drain region in a third region of said semiconductor substrate.

9. The method of claim 8, wherein said gate insulator layer is silicon dioxide, thermally grown to a thickness between about 50 to 100 Angstroms.

10. The method of claim 8, wherein said first polysilicon layer is deposited via LPCVD procedures, to a thickness between about 1500 to 2000 Angstroms.

11. The method of claim 8, wherein said ONO layer is an oxidized silicon nitride layer, on a silicon oxide layer, formed by initially growing a silicon oxide layer on said first polysilicon layer, followed by the deposition of a silicon nitride layer, and oxidation of the silicon nitride layer, creating said ONO layer at an equivalent silicon dioxide thickness between about 100 to 250 Angstroms.

12. The method of claim 8, wherein said second polysilicon layer is deposited via LPCVD procedures, to a thickness between about 2500 to 5000 Angstroms.

13. The method of claim 8, wherein said stacked gate structures, comprised of said second polysilicon layer, said ONO layer, and said first polysilicon layer, are formed via an anisotropic RIE procedure, using $Cl_2$ as an etchant for the polysilicon layers, while using $CHF_3$, as an etchant for said ONO layer.

14. The method of claim 8, wherein said source region, formed in said first region of said semiconductor substrate, is created via ion implantation of arsenic or phosphorous, at an energy between about 30 to 60 KeV, at a dose between about 3E15 to 5E15 atoms/cm$^2$.

15. The method of claim 8, wherein said silicon nitride layer, of said composite layer, is deposited using LPCVD or PECVD procedures, to a thickness between about 500 to 1500 Angstroms.

16. The method of claim 8, wherein said field oxide regions are formed in said second region of said semiconductor substrate, via thermal oxidation, in an oxygen-steam ambient, at a temperature between about 950 to 1000° C., to a thickness between about 2000 to 4000 Angstroms.

* * * * *